(12) United States Patent
Kuriyama et al.

(10) Patent No.: US 6,573,471 B1
(45) Date of Patent: *Jun. 3, 2003

(54) WELDING METHOD FOR SEMICONDUCTOR MATERIALS

(75) Inventors: Kazuya Kuriyama, Osaka (JP); Yoichiro Hanada, Osaka (JP)

(73) Assignee: Komatsu Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/216,275

(22) Filed: Dec. 18, 1998

(30) Foreign Application Priority Data

Dec. 19, 1997 (JP) .............................. 9-365188

(51) Int. Cl.$^7$ .............................................. B23K 15/00
(52) U.S. Cl. ................................................ 219/121.14
(58) Field of Search ...................... 219/121.14, 121.46, 219/121.64, 137 WM; 438/455; 156/272.2, 272.8

(56) References Cited

U.S. PATENT DOCUMENTS 3,424,890 A * 1/1969 Van Ruyven .......... 219/121.64
4,357,517 A * 11/1982 Sivry et al. ......... 219/121.14 X

FOREIGN PATENT DOCUMENTS

JP 60-108187 * 6/1985
JP 2-151385 * 6/1990

* cited by examiner

Primary Examiner—Samuel M. Heinrich
(74) Attorney, Agent, or Firm—Darby & Darby

(57) ABSTRACT

Two overlapped semiconductor materials are welded by a melt welding under the influence of a heat source of high energy density. The energy output of the heat source is ramped up slowly at the beginning of welding and ramped down slowly at completion of welding. In one embodiment the semiconductor materials are preheated before welding. In another embodiment, the effective position of the heat source on the semiconductor materials is periodically deflected.

14 Claims, 7 Drawing Sheets

STATIONARY

UNDERCUT

END PORTION NOTCH

WELDING METHOD FOR SEMICONDUCTOR MATERIALS

BACKGROUND OF THE INVENTION

1. Field of the Invention

The present invention relates to a welding method for a semiconductor material such as single crystal or polycrystal silicon (hereinafter referred to as "Si"), gallium (hereinafter referred to as "Ga") or arsenic (hereinafter referred to as "As"), wherein the semiconductor materials are welded by means such as electron beam, laser beam, or arc.

2. Description of the Related Art,

The physical and electrical properties of Si, when used as a semiconductor, have made it very popular. Si is especially utilized as a bulk material for substrates of DRAMs (Direct Random Access Memories) or MPUs (Micro Processor Units). The demand therefor is growing mostly for use as wafers. The diameters of wafers are becoming larger in order to produce more circuits in a single operation. Si ingots, of which wafers are made, currently exceed 200 kg in weight. As a consequence of this weight, it is necessary to consider how to hold and transport such ingots during subsequent manufacturing processes.

Besides the use of Si in semiconductors, it is often used also for manufacturing jigs for handling products. This use arises from the need to avoid contamination of metal in the products. The difficulty of manufacturing such jigs increases with increases in the weight and diameter of the ingots.

Though one may consider processing the Si ingots themselves to enable transport thereof, such a measure is attended by further problems such as higher costs and complication of manufacturing processes that need to be solved, since Si is a material that is hard to process and also requires certain treatments such as post-process washing.

For obtaining high-performance silicon wafers, thermal treatment at high temperature or film forming is performed by batch processing. Metallurgical tools for holding wafers during such batch processing have conventionally been made of quartz. However, single-crystal silicon boards are increasingly used to satisfy the need for wafers of larger diameter. The use of such boards is advantageous because the characteristics of the boards are identical to those of the wafers. As a result, use of single-crystal silicon boards are effective in decreasing the contamination level of the wafers.

However, it is presented a drawback in that these boards need to be manufactured through cutting from silicon ingots of single crystal whereby mechanical processing of these becomes quite expensive. Thus, it is desirable to find a way to freely connect these components in order to improve the degree of freedom for processing them.

Japanese Patent Application No. 3-107853 (1991) discloses a connection technique for wafers in which SOI wafers are manufactured by pasting wafers. Such a connection technique is employed with the aim of improving electric characteristics. This technique differs from the purpose of the present invention which is directed to structural characteristics.

Semiconductor materials such as Si are very brittle and are destroyed when subjected to high thermal gradients applied thereto. Accordingly, it was believed impossible to join semiconductor materials such as Si by welding.

OBJECTS AND SUMMARY OF THE INVENTION

It is an object of the invention to provide a welding method for semiconductor materials which overcomes the drawbacks of the prior art.

The inventors have achieved the present invention based on the fact that melt welding of semiconductor materials such as Si is possible while limiting metallic contamination or other contamination, such as oxidation, by employing a heat source of high energy density. The present invention enables welding of brittle semiconductor materials such as Si which were considered to be impossible to weld due to their very brittle characteristics. Utilizing a heat source of high energy density makes it possible to weld members made of semiconductor materials such as Si which could only be manufactured using mechanical processing techniques in the prior art. Besides joining members of Si, the present invention permits the manufacture of members having shapes which would be impossible to product using mechanical processing. Thus, the present invention improves the degree of freedom for processing semiconductor materials.

According to the welding method for semiconductor materials of the present invention, a heat source of high energy density is employed for performing melt welding of semiconductor materials. The semiconductor materials may include Si, Ga or As. The heat source of high energy density may includes electron beam, laser beam, plasma-arc or arc welding techniques.

Adequate control during partial melting of members to be welded is difficult using ordinary type heat sources of low energy density. A substantial amount of heat must be applied to achieve suitable melting. This produces such a large heat shock in semiconductor materials such as Si, before sufficient partial melting occurs, that at least partial destruction of the members to be joined results. Utilizing a heat source of high energy density as in the present invention, partial heating and melting at very small energy occurs over a limited area. The portion subjected to melting can be gradually expanded while restricting the total amount of heat input. This reduces the heat shock imparted to the semiconductor materials such as Si to realize a desired melting portion. It should be noted that, while it is preferable that the heat source have a high energy density of not less than 10 kw/cm2, the present invention is not limited to this value.

In the welding method for semiconductor materials according to the invention the application of energy progresses outward from the initial point at the time of starting welding. The energy output is decreased toward the end of the welding operation.

Since the energy output can be progressed or decreased to achieve desired output values, cracks due to thermal stress resulting from abrupt temperature distribution changes are reduced. Since output control is easy especially with electron beams or laser beams, partial heating is enabled while freely controlling the temperature increase/decrease rate.

The welding method for semiconductor materials according to the invention includes preheating the workpiece before welding. The preheating temperature is preferably not less than 300° C., and more preferable, not less than 600° C.

Preheating increases the area in which satisfactory conditions for welding exists. While Si is very brittle at room temperature, it has a ductility similar to steel when it is heated to not less than 600° C. When preheating is performed, the cooling speed of the welding portion decreases as a matter of course. Thus, thermal stress owing from partial and abrupt shrinkage is reduced. Further, the region in which the temperature exceeds 600° C. is expanded beyond the proximity of the welding portion, whereby not only relief of thermal stress is achieved but also ductility is improved in portions at which the thermal stress is large, so that probability of cracking is decreased.

The welding method for semiconductor materials according to the invention includes performing the welding while adding a filler material which is identical to the semiconductor material.

Referring now to FIG. 1, an effective means for relieving thermal shocks is a method in which a filler material 1, which is a material identical to the base material such as Si in a form of a stick, wire or powder, is added to a welding portion 2. Utilizing Si materials or the like as filler elements 1, most of the energy of the heat source is consumed for melting the filler element 1 whereby the amount of heat input to the members 3, 3 being welded, is decreased. Thus, thermal shock applied to the members 3, 3 is decreased and favorable welding without destruction can be achieved.

For electron beam welding, electricity must pass through the Si member. However, resistivity values of Si vary greatly depending on the amount of impurities included therein, and may reach up to 10,000 ohm-cm at room temperature. Therefore, it may be that welding is badly affected by electrification in that beams are deflected from the welding portion. Such problems can be coped with by grounding guide tip portion A of the filler element 1 as well as the members 3, 3 as shown in FIG. 1. When the thermal capacity of the filler element 1 is small, its temperature is easily raised to present favorable characteristics as an electric conductor, whereby the above described problems are reliably eliminated.

The welding method for semiconductor materials according to the invention includes periodical deflection control of a heating concurrently with application of heat from heat source of high energy density.

For preventing contamination of the welding portion by metal or oxidation, void-free welding using electron beams or laser beams is achieved by degassing of a molten pool utilizing the periodical deflection of the heat source (zone). Moreover, by welding under decreased pressure, favorable welding of good quality is performed by further aiding prevention of oxidation and contamination.

As described so far, the present invention performs welding of semiconductor materials such as Si which was considered to be impossible to weld due to their very brittle characteristics. The welding is achieved by utilizing a heat source of high energy density, to permit welding of members made of semiconductor materials such as Si which could heretofore be manufactured only through mechanical processing. In addition, the present invention permits manufacturing of members having shapes which could not be obtained through mechanical processing. Consequently, the degree of freedom for processing semiconductor materials is remarkably improved.

In highly brittle materials such as Si, notches, such as undercuts in welding beads, decrease the strength of the material. It is thus required to reduce occurrence of undercuts. The techniques of the present invention achieve such reduction in undercuts. That is, by performing preheating, the wettability of the molten pool and of heated portions that are not melted is improved, thereby reducing or preventing undercuts. The addition of filler elements is also effective in preventing undercuts. Further, performing periodic deflection control of the heat zone also reduces the occurrence of undercuts by vibration of the molten pool etc.

When using semiconductor materials such as Si, protrusions may be formed at end portions of the welding which are due to directional solidification. Such protrusions may decrease the strength of the welded structure. However, by decrement the energy output near the end of welding, the size of the molten pool is gradually decreased, whereby the formation of protrusions is reduced or eliminated. As a result, the reduction in strength can be prevented.

Briefly stated, the present invention provides a method for welding two overlapped semiconductor materials by melt welding under the influence of a heat source of high energy density. The energy output of the heat source is ramped up slowly at the beginning of welding and ramped down slowly at completion of welding. In one embodiment the semiconductor materials are preheated before welding. In another embodiment, the effective position of the heat source on the semiconductor materials is periodically deflected during welding.

According to an embodiment of the invention, there is provided a method for welding semiconductor materials comprising: positioning first and second semiconductor materials to be welded in proximity with each other, and applying heat from a heat source of high energy density to perform melt welding of the semiconductor materials.

According to a feature of the invention, there is provided a method for welding first and second members of a semiconductor material comprising: positioning said first and second members adjacent each other with surfaces to be welded facing each other, preheating the first and second members to a preheat temperature of at least 300° C., applying a heat source of high energy density to the surfaces, the step of applying including increasing an energy output of the heat source over a first substantial period at a beginning of said welding, the step of applying further including decreasing said energy output over a second substantial period at an end of the welding, and periodically moving a contact point of the heat source on the first and second members during the welding.

The above, and other objects, features and advantages of the present invention will become apparent from the following description read in conjunction with the accompanying drawings, in which like reference numerals designate the same elements.

EMBODIMENTS

Embodiment 1

Figure 2:
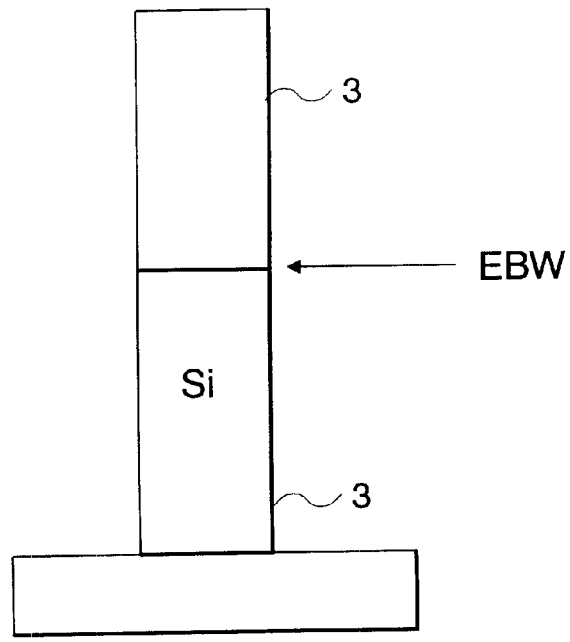
FIG. 2 is an explanatory view showing a condition of a weld coupling according to an embodiment of the present invention.

Referring to FIG. 2, single crystal Si members 3, 3, having a diameter of 8 mm were laterally overlapped. Electron beam welding was performed from a horizontal direction directed to the overlapped portion. First, tack welding was performed through two-point welding. After confirming that the overlapped Si members 3, 3 were unable to shift, electron beam welding was performed over the whole circumference while rotating the work. The clearance of the welding portion is set to be 0.5 to 1 mm. The welding conditions were set to achieve an acceleration voltage of 130 kv and a beam current of 5 mA. A rise time of 15 seconds were set to reach 5 mA at the starting welding. A descending time of 15 seconds from 5 mA was set at the terminating welding. The atmospheric pressure was maintained at not more than 0.05 Torr. It should be noted that while it is possible to perform welding with a clearance of not more than 1 mm between contact surfaces before welding, it is preferable that the contact surfaces be grounded in case the welding portion needs to be of a certain coaxial degree.

Figure 4:
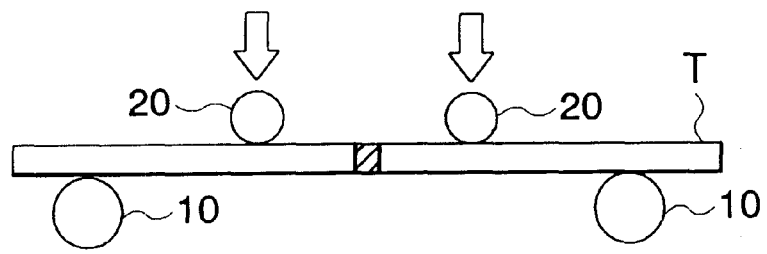
FIG. 4 is a schematic view for explaining a method for performing bending tests of samples.

Referring to FIG. 4, bending tests were performed on various samples welded in the above described manner. The bending test was a four-point bending test. The bending tests was performed as follows: a sample T was disposed between receiving rolls 10, 10 which were aligned at an interval of approximately 75 mm apart. Pressing rolls 20, 20 were aligned at an interval of 30 mm apart positioned centrally between the receiving rolls 10, 10. A downward force was exerted on the pressing rolls 20, 20, as indicated by the downward pointed arrows. The positioning of the rolls 20, 20 and the rolls 10, 10 equalizes the stress actuating on the welding portion.

Figure 5:
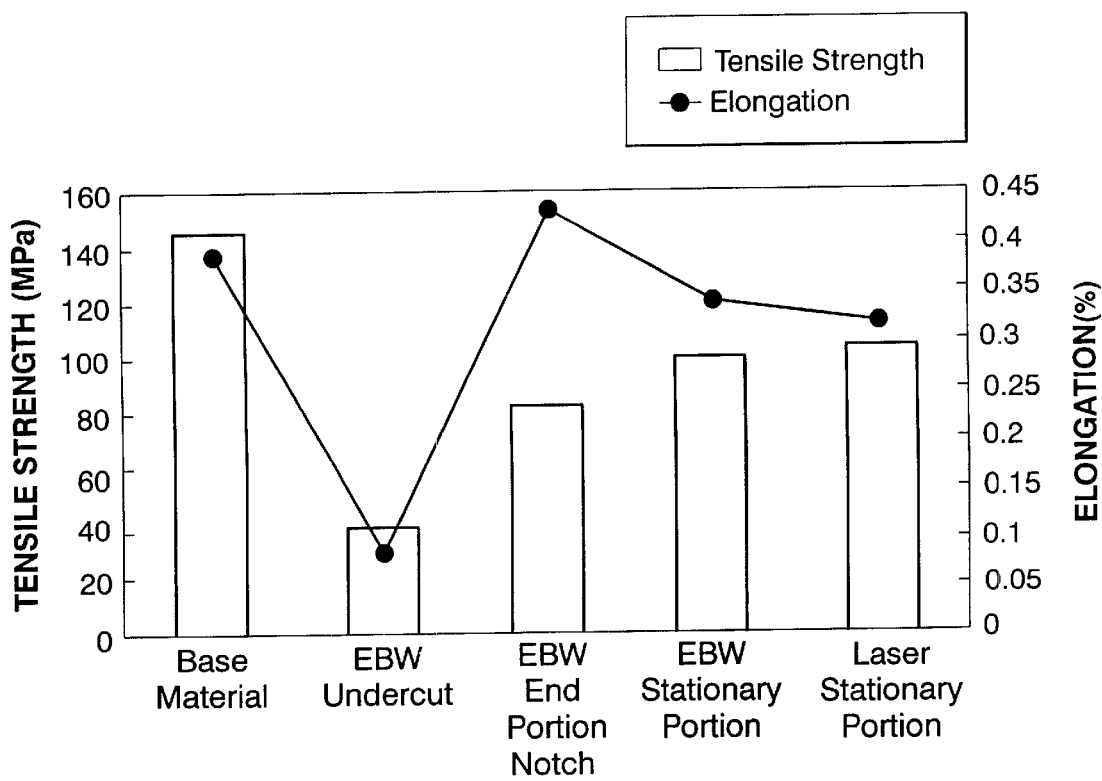
FIG. 5 is a graph showing results of the bending test of weld couplings in the above embodiment.
Figure 6A:
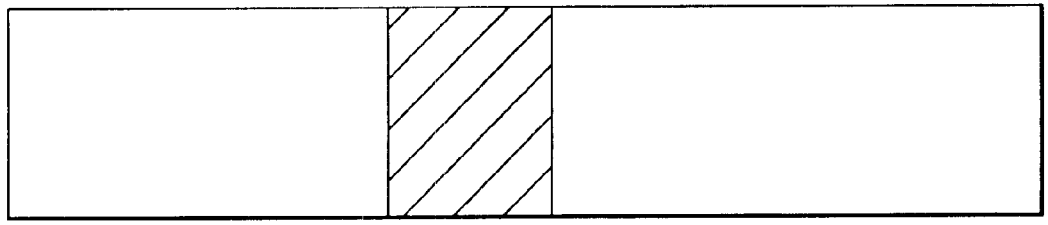
FIGS. 6(a)–6(c) are explanatory views schematically showing shapes of welding portions in the above embodiment.
Figure 6B:
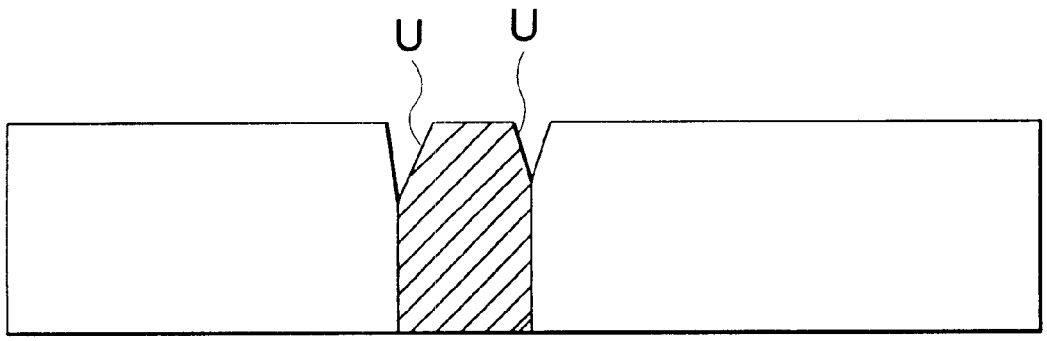
Figure 6C:
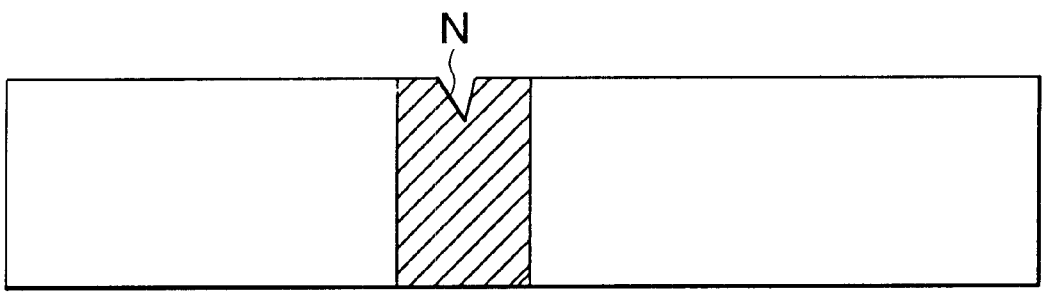

The test results are shown in FIG. 5. In the drawings, there are also shown test results of samples obtained through laser beam welding. In the drawings, a "stationary portion" denotes a coupling having wholesome beads with no deficiencies in shape shown in FIG. 6(a), an "undercut" denotes a coupling in which an undercut U resides at both sides of the bead as shown in FIG. 6(b), and a "notch" denotes a coupling in which a notch N resides in a central portion of the bead end portion as shown in FIG. 6(c). As is clear from FIG. 5, welding characteristics of stationary portions obtained through electron beam welding are substantially equal to those of the base material in terms of tension strength and elongation. Stationary portions obtained through laser beams also have welding characteristics similar to those of portions obtained through electron beams. It is apparent from this fact that differences in welding methods have only a minor effect on weld strength.

Figure 1:
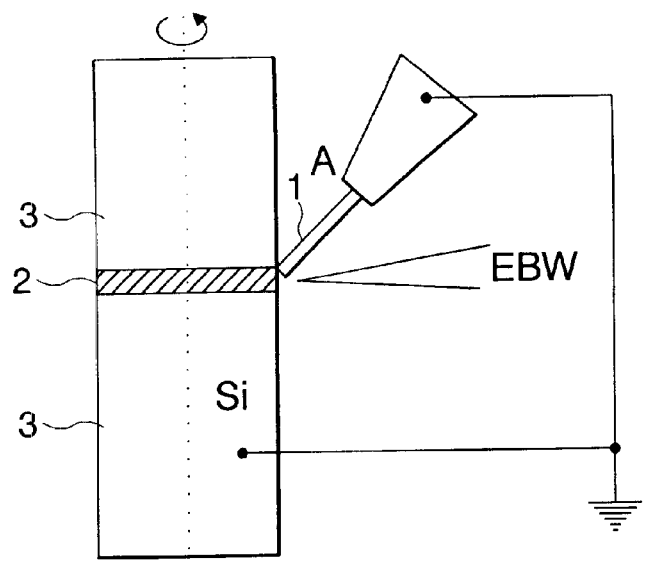
FIG. 1 is an explanatory view showing an example of a method for adding a filler element in the method according to the present invention.

It is also clear from FIG. 5 that the tensile strength of couplings in which failures, which are discontinuations in shape such as undercuts or notches, reside decreases. It has already been confirmed that the occurrence of such undercuts or notches can be prevented by performing preheating, by adding filler elements as shown in FIG. 1, or by performing deflection control of beams (weaving).

Embodiment 2

Figure 7A:
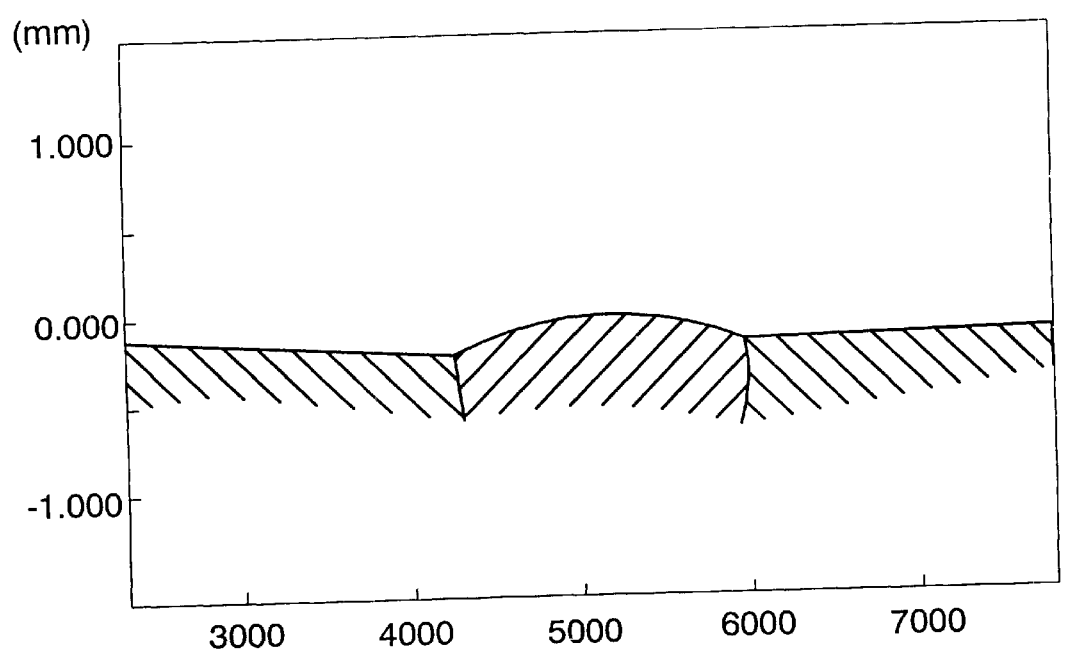
FIGS. 7(a) and 7(b) are schematic views of a bead section showing the effect of performing decrement control of energy output in the above embodiment.
Figure 7B:
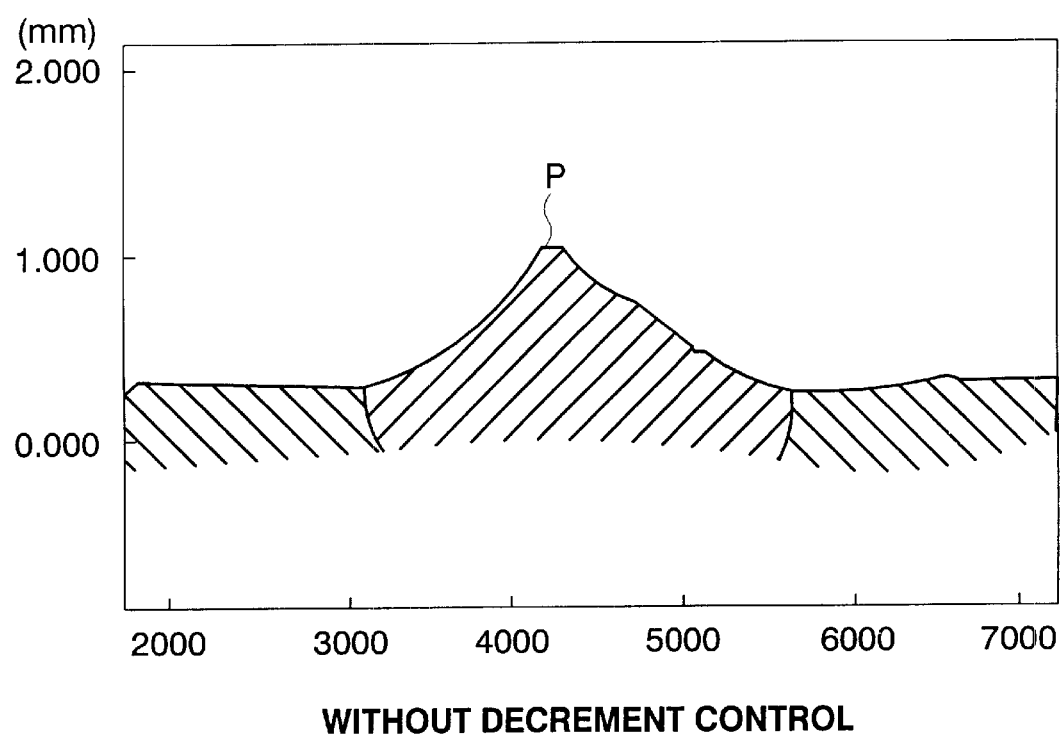

It has been confirmed of effects of controlling the decrement of energy output during the termination welding in the above described Embodiment 1. The results thereof are shown in FIG. 7. FIG. 7(a) shows a sectional shape of a bead at an end portion obtained in the above described Embodiment 1. FIG. 7(b) shows a sectional shape of a bead at an end portion of which no decrement control was performed. As is clear from the drawings, protrusions P in FIG. 7(b) are formed due to directional solidification which is a characteristic of Si in the absence of decrement control. However, in case decrement control has been performed, the molten pool is controlled in a gradually decreasing manner so that forming of protrusions is remarkably restricted, as shown in FIG. 7(a). By eliminating discontinuities in shape in this manner, the welding strength is improved.

Embodiment 3

Figure 3:
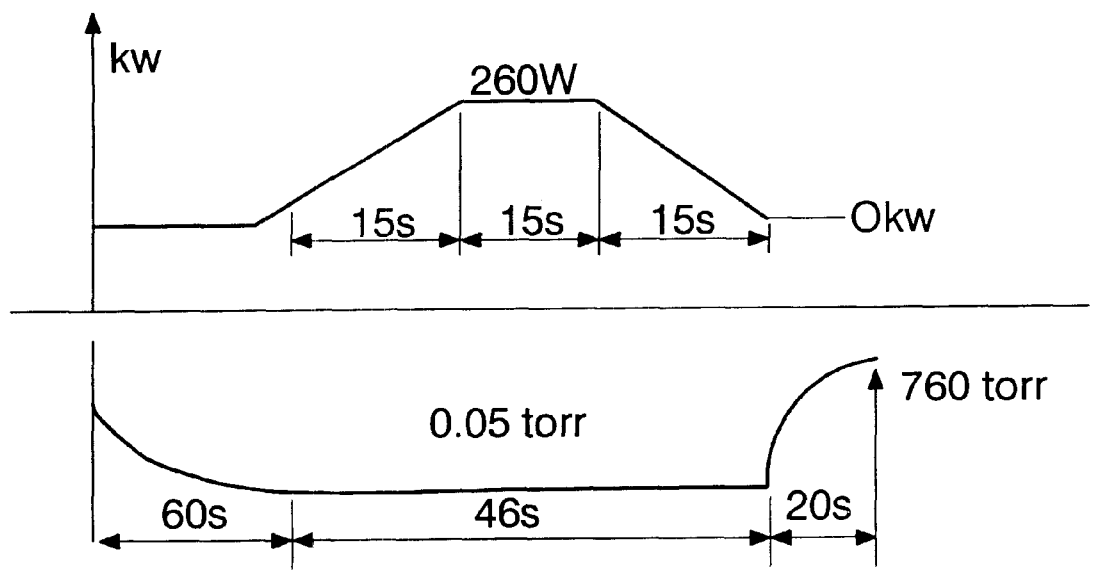
FIG. 3 is a graph schematically showing welding conditions in the above embodiment.
Figure 8:
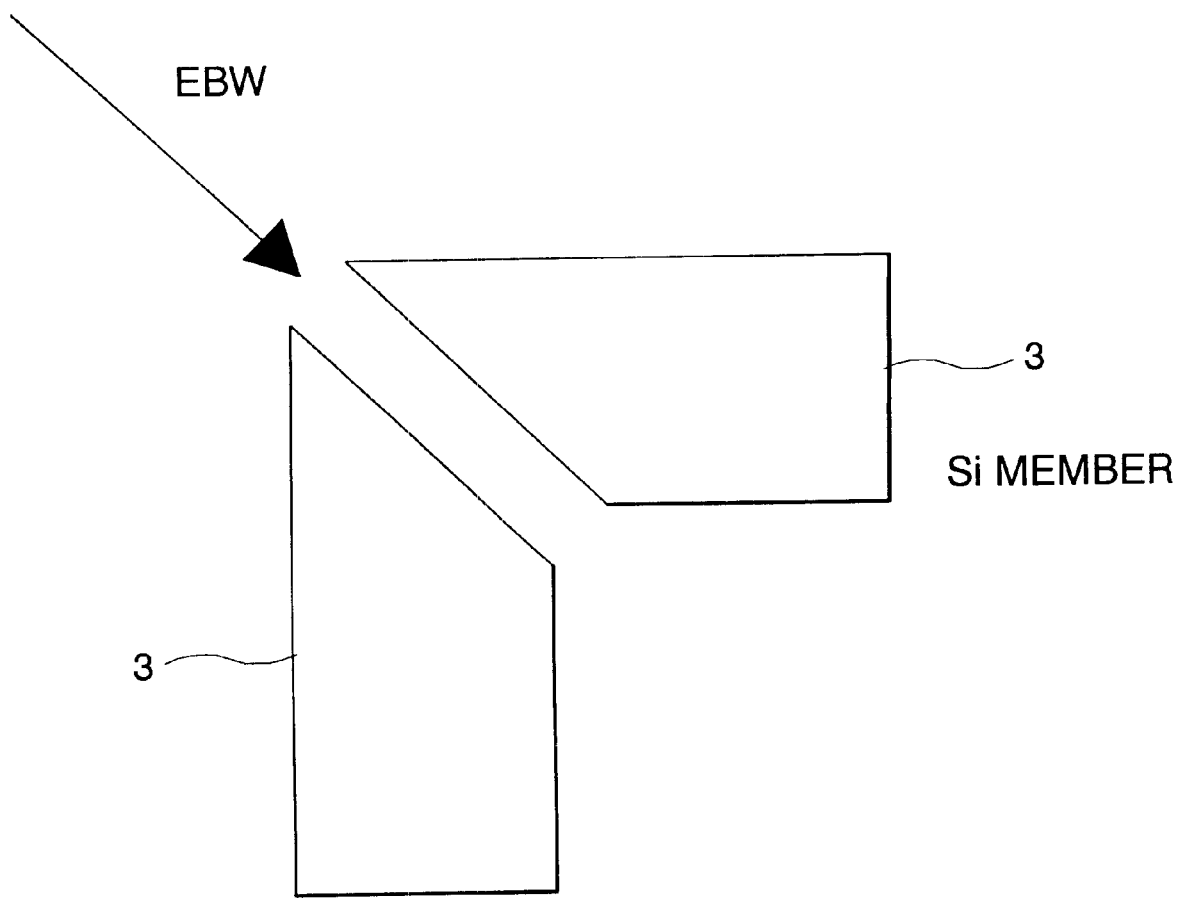
FIG. 8 is an explanatory view showing shapes of welding portions according to another embodiment of the present invention.

Referring now to FIG. 8, another embodiment of the invention includes changing the shape of the . In this embodiment, polycrystal Si members 3, 3 having a diameter of 6 mm are crossed at 90 degrees and are welded. In this coupling, joining surfaces were cut to 45 degrees and fixed facing each and fixed in position by a jig. The clearance between the members 3, 3 is set to be 0.5 to 1 mm. Then, welding was performed by spot irradiation of electron beams along the overlapping surface as shown in the drawings. The welding conditions are identical with those as shown in FIG. 3. While couplings assume different shapes at their welding portions after welding which are due to directional differences of the gravity head actuating on the molten pool when irradiation of the electron beam is performed in a horizontal direction and when irradiation is performed in a vertical direction, both methods are effective in obtaining favorable couplings.

Embodiment 4

Butt circumferential welding of single crystal Si members having a diameter of 100 mm was performed using electron beams. Welding was performed with an acceleration current of 130 Kv, an output current of 5 mA, a rise time of 15 seconds, and a descend time of 15 seconds. Favorable welding was achieved over the whole circumference with a depth of fusion of approximately 3 mm.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method for welding semiconductor materials comprising:

positioning first and second semiconductor materials to be welded in proximity with each other;

reducing an atmospheric pressure surrounding said first and second semiconductor materials to less than or equal to 0.05 Torr; and applying heat from a heat source of high energy density to perform melt welding of said semiconductor materials.

2. The welding method for semiconductor materials according to claim 1, wherein said first and second semiconductor materials are one of silicon, gallium and arsenic.

3. The welding method for semiconductor materials according to claim 1, wherein said heat source of high energy density is one of an electron beam, a laser beam, a plasma-arc and an arc.

4. The welding method for semiconductor materials according to claim 1, further comprising:

raising an energy output of said heat source to a final value over a time at a beginning of welding; and decrementing said energy output over a time at a termination of welding.

5. The welding method for semiconductor materials according to claim 4, further comprising preheating said first and second semiconductor materials to a predetermined temperature before beginning said welding.

6. The welding method for semiconductor materials according to claim 5, wherein said predetermined temperature is not less than 300° C.

7. The welding method for semiconductor materials according to claim 5, wherein said predetermined temperature is not less than 600° C.

8. The welding method for semiconductor materials according to claim 1, further comprising adding a filler element of a material identical with the semiconductor material during the step of applying heat.

9. The welding method for semiconductor materials according to claim 1, further comprising periodically deflecting a position of said heat source on said first and second semiconductor material during said welding.

10. A method for welding first and second members of a semiconductor material comprising:

positioning said first and second members adjacent each other with surfaces to be welded facing each other;

preheating said first and second members to a preheat temperature of at least 300° C;

applying a heat source of high energy density to said surfaces;

the step of applying including increasing an energy output of said heat source over a first period at a beginning of said welding;

the step of applying further including decreasing said energy output over a second period at an end of said welding; and periodically moving a contact point of said heat source on said first and second members during welding.

11. A method according to claim 10, wherein said preheat temperature is at least 600° C.

12. A method according to claim 10, wherein said first period is at least 15 seconds.

13. A method according to claim 10, wherein said second period is at least 15 seconds.

14. A method according to claim 10 wherein said first and second periods are both at least 15 seconds.

* * * * *